United States Patent
Wei

(10) Patent No.: US 8,067,982 B2
(45) Date of Patent: Nov. 29, 2011

(54) TRANSCONDUCTANCE AMPLIFIER WITH IMPROVED LINEARITY

(75) Inventor: James Wei, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/523,390

(22) PCT Filed: Jan. 15, 2008

(86) PCT No.: PCT/EP2008/050369
§ 371 (c)(1),
(2), (4) Date: Jan. 28, 2010

(87) PCT Pub. No.: WO2008/090051
PCT Pub. Date: Jul. 31, 2008

(65) Prior Publication Data
US 2010/0176884 A1    Jul. 15, 2010

(30) Foreign Application Priority Data
Jan. 16, 2007 (FR) .................................. 07 00285

(51) Int. Cl.
*H03F 3/45* (2006.01)
(52) U.S. Cl. ....................... 330/253; 330/257
(58) Field of Classification Search ............ 330/253, 330/257, 258
See application file for complete search history.

(56) References Cited

U.S. PATENT DOCUMENTS

| | | | |
|---|---|---|---|
| 3,984,780 A | 10/1976 | Hsiao et al. | |
| 4,103,190 A | 7/1978 | Beutler | |
| 6,150,885 A * | 11/2000 | Ashby et al. | .................. 330/257 |

OTHER PUBLICATIONS

Kwan, Tom, Martin, Ken, An Adaptive Analog Continuous-Time CMOS Biquadratic Filter, Proceedings of the IEEE Custom Integrated Circuits Conference, 1991.
Kwan, Tom and Martin, Ken, An Adaptive Ananog Continuous-Time CMOS Biquadratic Filter, IEE Journal of Solid-State Circuits, vol. 26, No. 6, Jun. 1991.
Sedra, A.S., Roberts, G.W., Gohh, F. The Current Conveyor; History, Progress and New Results, IEE Proceedings, vol. 137, Pt. G, No. 2, Apr. 1990.

* cited by examiner

*Primary Examiner* — Steven J Mottola
(74) *Attorney, Agent, or Firm* — LaRiviere, Grubman & Payne, LLP

(57) ABSTRACT

The invention relates to a transconductance amplifier, intended to supply current variations di when it receives voltage variations dv, with a desired conversion coefficient Gm called transconductance: Gm=di/dv.
The amplifier comprises a PMOS transistor (MP1) and an NMOS transistor (MP2) connected by their drains, their gates both being connected to the voltage input receiving dv; the source of the first transistor is connected to a constant current source ($I_{B1}$) and to a resistor (R) and to the drain of a third MOS transistor (MN3) of the same type as the first; the sources of the second (MN2) and third (MN3) transistors are commoned, the gate of the third transistor being connected to the drains of the first and second; the output is connected to a circuit (MN4) which mirrors the current of the third transistor. The resulting amplifier has good linearity and can be used in a sample and hold device used to sample charges.

13 Claims, 3 Drawing Sheets

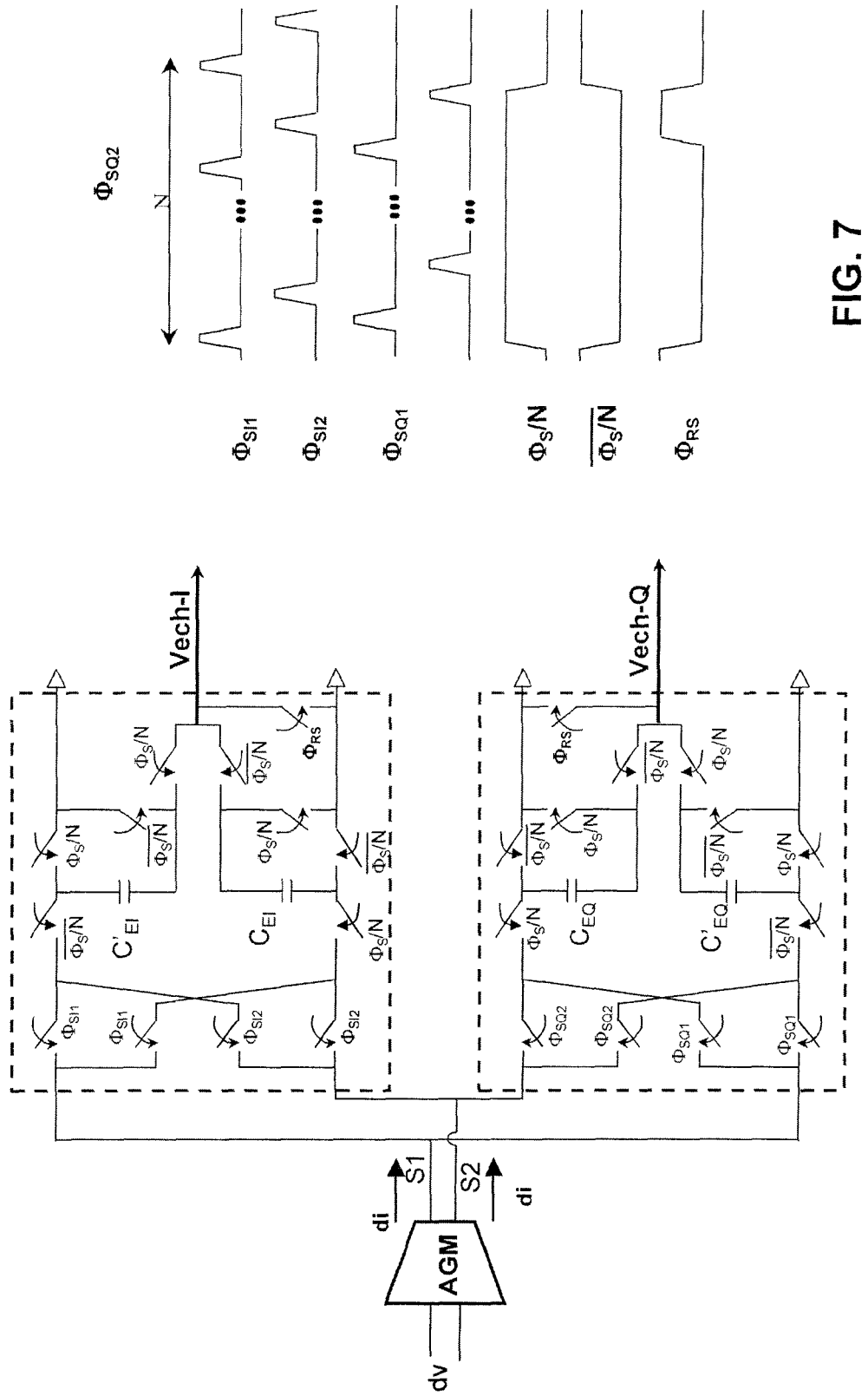

US 8,067,982 B2

TRANSCONDUCTANCE AMPLIFIER WITH IMPROVED LINEARITY

The invention relates to a transconductance amplifier, intended to supply current variations di when it receives voltage variations dv, with a desired conversion coefficient Gm called transconductance: Gm=di/dv.

The invention can be applied more particularly to produce certain types of sample-and-hold devices, more specifically that operate by sampling a quantity of charges rather than a one-off voltage value. Moreover, the invention applies not only to circuits intended to convert a simple voltage variation into a simple current variation, but also to differential circuits intended to convert a differential voltage variation into a differential current variation.

To situate the context of this invention, it may be recalled that it is often preferable to sample charges rather than voltages, to reduce the influence of the clock noise (often also referred to as "jitter") when a high-frequency signal is to be sampled under the control of a clock that defines the periodic sampling phases. By integrating a current for a known sampling duration rather than a voltage level in a sampling capacitor, the influence of this clock noise is reduced. However, since the input signal to be converted generally takes the form of a voltage (or more precisely high-frequency voltage variations), a high-quality transconductance amplifier must be placed upstream of the sampling capacitor or capacitors to accurately convert the voltage variations into current variations. The current sampling is, moreover, useful if multiple samples are to be integrated in one and the same capacitor.

The performance levels expected of such a transconductance amplifier are as follows: a high and very well known transconductance value, a linear behavior, that is, a transconductance that is independent of the signal level to be converted, a high output impedance, an internal noise that is as low as possible, a wide bandwidth.

Some of these performance characteristics are contradictory. In practice, to obtain a wide bandwidth, in particular toward the high signal frequencies, the circuit must be produced using technologies with very small gate lengths, notably so-called submicronic technologies (transistors with a channel length that is only a fraction of a micrometer). However, transistors with very short channel lengths have a natural drain-source transconductance $g_{ds}$ that is not zero as would be the case for an ideal transistor; the natural drain-source transconductance $g_{ds}$ is the ratio between the drain current (in small signals) that passes through the transistor and the voltage (in small signals) between drain and source for a given bias of the transistor. If this transconductance is not zero, that is to say, if the drain current variations are not independent of the voltage variations between drain and source, then it will be found that it is difficult to obtain a transconductance amplifier with a sufficiently high and sufficiently linear value, with a very high output impedance, and with low noise; the noise at 1/f notably increases a lot.

Consequently, it becomes necessary to choose between a wide bandwidth, obtained by miniaturization of the technology, and the other qualities of the transconductance amplifier.

FIG. 1 represents an exemplary MOS-technology transconductance amplifier proposed in the prior art by T. Kwan and K. Martin in "An Adaptive Analog Continuous-time CMOS biquadratic filter" in IEEE Journal of Solid State Circuits Vol. 26 pp 859-867, June 1991.

The transconductance amplifier of FIG. 1 is a differential amplifier having two inputs E, E', between which is applied a differential input voltage (in small, high frequency signals) V+dv, V−dv, to be converted into differential current I−di, I+di on two current differential outputs S and S'. V is a common-mode voltage on the inputs, I is an identical bias current on both outputs.

The amplifier is symmetrical since we are working here in differential mode and therefore comprises two identical halves. The first half comprises a series assembly of a first and a second MOS transistors (MP1, MN2) of opposite types connected by their drains; the gate of the first transistor MP1 is connected to the input E; the source is connected to a constant current source $I_{B1}$ and to a resistor of value R and to the drain of a third MOS transistor MN3 of the same type as the second; the source of the second transistor MN2 and that of the third transistor MN3 are grounded (Vss); the gate of the transistor MN3 is connected to the drains of the first and second transistors; and the amplifier also includes a fourth transistor MN4, the function of which is to mirror toward the output S the current that passes through the transistor MN3; the sources of the second and fourth transistors, MN2 and MN4, are therefore connected, as are their gates. Finally, the gate of the transistor MN2 is biased by a fixed voltage $V_{bias}$ so this transistor acts as a current source and maintains a constant current value, of value $I_{B2}$, in the transistors MP1 and MN2. The other half of the amplifier comprises an identical assembly of four transistors, designated by the same references but with an apostrophe added, and connected in the same way between the input E' and the output S'; the current sources are identical in both halves of the amplifier, as are the resistors and the transistor constructions. The resistors of value R are connected together and constitute a single resistor of value 2R divided between the two halves of the amplifier; this resistor of value 2R in effect connects the drains of the third transistors MN3, MN3' of the two assemblies.

This arrangement ideally functions as follows: the transistor MP1 through which a constant current passes is a voltage follower; the small variations dv on its gate are fully reflected on its source. The same applies to MP1', with an opposite variation (−dv). The resistor of value 2R sees a voltage variation 2dv at its terminals. It is passed through by a current variation di=2dv/2R=dv/R which can circulate neither in the branch $I_{B1}$ nor in the transistors MP1, MN2, MP1', MN2', the currents of which are fixed at $I_{B2}$. The current variation dV/R can flow only in the transistors MN3 (in one direction) and MN3' (in the other direction). In practice, a current I−di flows in the transistor MN3 and a current I+di flows in the transistor MN3', where the common bias current I is simply $I_{B1}-I_{B2}$.

The currents I−di and I+di are mirrored by the transistors MN4 and MN4' to form the output differential currents I−di=I−dv/R in one direction on S, and I+di=I+dv/R in the other direction on S'. The amplifier therefore has a transconductance di/dv equal to 1/R for the small signals; this transconductance is well controlled and very linear. For simplicity, it is assumed that the current mirroring is done with a factor 1. It will be understood that this factor could be different by choosing a ratio of geometries different from 1 between the transistors MN3 and MN4.

However, this presupposes transistors and a current source $I_{B1}$ (also in practice formed by a transistor) that have ideal characteristics and in particular a natural zero drain-source transconductance $g_{ds}$. When it is not zero, a situation is obtained in which the transistors MP1 and MP1' do not act as voltage followers and the differential output current di then depends on the level of the input signal dv; this is difficult to accept, notably in the sample-and-hold applications, above all if the sampling is done for an accurate analog-digital conversion. Furthermore, with non-ideal transistors, more particularly in submicronic technology (gate lengths less than 1 micrometer), the output impedances are reduced, and the spurious capacitances begin to reduce the bandwidth.

To improve the trade-off between the different qualities of the transconductance amplifier, it is proposed, according to the invention, to modify the amplifier principle that has just been described, to make the transconductance value notably more independent of the signal level, even when the transistors that make up the circuit have a non-negligible natural transconductance $g_{ds}$. The production of a good transconductance amplifier is thus made compatible with the submicronic technologies which also make it possible to work at higher frequency.

It will be noted that the modified amplifier according to the invention could also be produced with bipolar transistors, and consequently, in everything that follows it will be assumed that the designation "transistor" covers both MOS transistors and bipolar transistors and the designations "source", "drain" and "gate", conventionally used for MOS transistors, must be interpreted as respectively meaning "emitter", "collector" and "base", if the transistors are bipolar. MOS transistors of opposite types are then NMOS and PMOS transistors, bipolar transistors of opposite types are NPN and PNP transistors respectively.

More specifically, it is proposed according to the invention to connect not only the gate of the first transistor MP1 but also the gate of the second transistor MN2 to the signal input to be converted E. This is equally valid in differential mode (in which the resistor R is connected between the drains of the two transistors MN3 and MN3') as in the case of a simple, non-differential amplifier (in which the resistor R would be connected to a fixed potential).

Consequently, the invention proposes a transconductance amplifier for the conversion of small electrical voltage variations dv into electrical current variations di, comprising a series assembly of a first and a second transistors of opposite types connected by their drains, the gate of the first transistor being connected to an input for voltage signals to be converted into current, the source of the first transistor being connected to a constant current source and to a resistor and to the drain of a third transistor of the same type as the first, the sources of the second and third transistors being commoned, the gate of the third transistor being connected to the drains of the first and second transistors, and the amplifier also including a circuit for mirroring the current of the third transistor, this mirroring circuit constituting a transconductance amplifier output, characterized in that the gate of the second transistor is connected to the gate of the first transistor.

By applying the signal dv both to the gate of the transistor MP1 (tending to cause the drain current of MP1 to vary in one direction) and to the gate of the transistor MN2 (tending to cause the drain current of MN2 to vary in the other direction), it is observed that the loop gain of the follower transistor is improved, that is to say that a better equality is obtained between the gate potential variations dv and the potential variations on the drain of the follower transistor MP1.

Preferably, a feedback circuit is provided for controlling the value of the current source in a direction tending to keep the common-mode voltage as constant as possible on the drains of the first and second transistors.

The transconductance amplifier according to the invention (primarily in its differential version) is particularly useful in one application to a sample-and-hold device, for example an input sample-and-hold device of a very rapid analog/digital converter. It is then used to charge, during a periodic sampling phase of constant duration, at least one sampling capacitor.

The invention is also applicable to the production of finite impulse response sampled filters, notably in telecommunications for filtering and changing the frequency of a radiofrequency signal.

Other features and benefits of the invention will become apparent from reading the detailed description that follows and that is given with reference to the appended drawings in which:

FIG. 1, already described, represents a transconductance amplifier of the prior art;

FIG. 6 represents an application of the transconductance amplifier as an input circuit of a sample-and-hold device;

FIG. 7 represents the timing diagram of operation of the circuit of FIG. 6.

Figure 1:
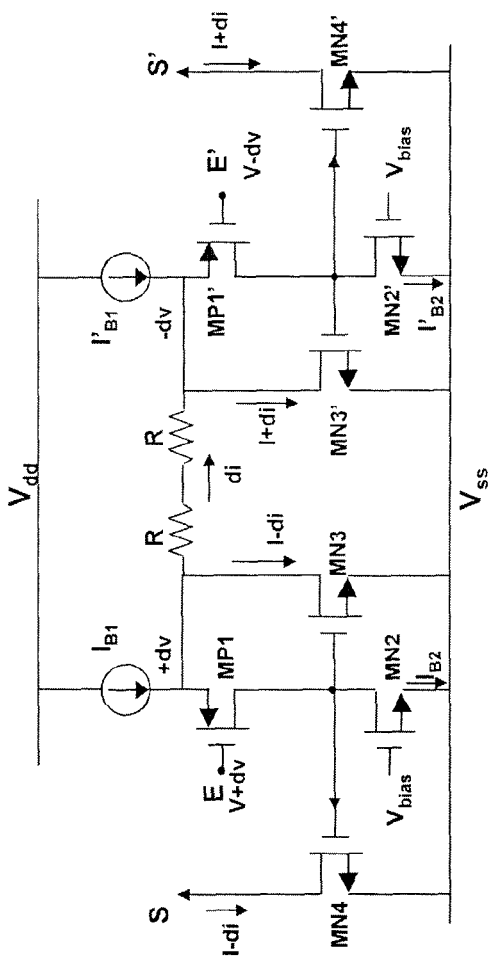
Figure 2:
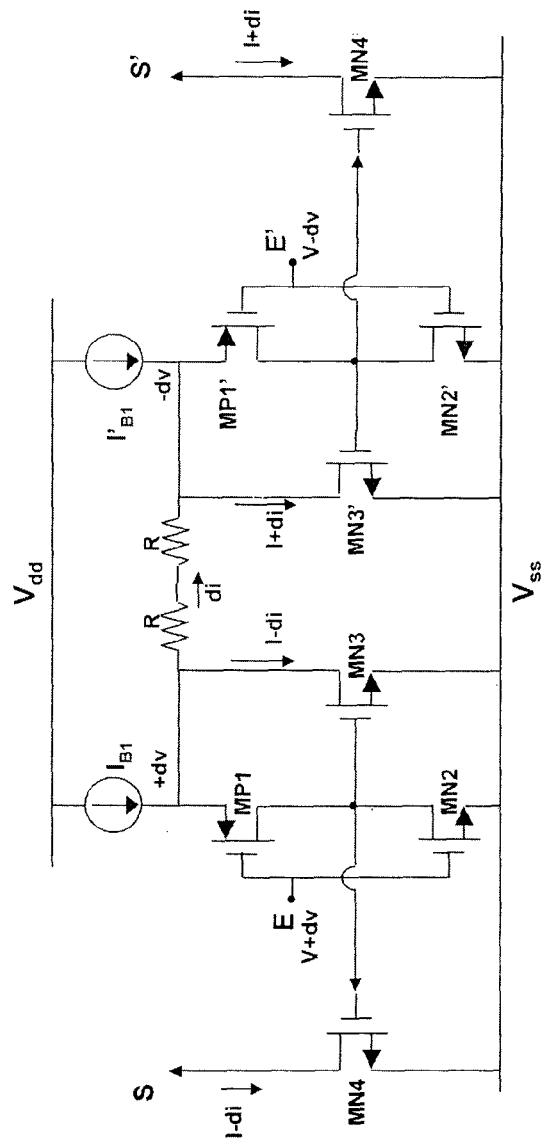
FIG. 2 represents a differential transconductance amplifier according to the invention.

FIG. 2 will be described with reference to FIG. 1, already described in detail. In practice, the circuit elements are the same and only the gate connection of the transistor MN2, and obviously also of the transistor MN2', is different.

The gate of the second transistor MN2 is not connected to a constant bias voltage tending to make this transistor a simple constant current source, but it is connected to the gate of the first transistor MP1, that is to say, it is connected to the input E which receives the voltage V+dv to be converted into current. Similarly, the gate of the transistor MN2' is now connected to the gate of the transistor MP1'.

Although this configuration tends to increase the input spurious capacitance, since there are now two transistor gates connected to the input, it is observed that the configuration improves the linearity, because it reduces the influence of the value of the natural drain-source transconductances of the transistor MP1 and of the current source $I_{B1}$.

In the diagram of FIG. 1, the transistor MP1 that is passed through by a constant current is a voltage follower but its natural drain-source transconductance (variation of drain current with the drain-source voltage in small signals) means that the voltage on its source does not exactly follow the voltage on its gate. The small deviation that is produced tends to be reflected on the current that passes through the resistors of value R and therefore on the value of the transconductance of the amplifier. The latter starts to depend on the amplitude of the input signal dv. However, the voltage variation dv applied to the input acts not only on the transistor MP1 but also on the transistor MN2; and it acts in a contrary direction, that is to say that it tends to compensate the effect that is produced by the fact of the non-zero transconductance of the transistor MP1. In total, if it is accepted that the transconductances of MP1 and MN2 are substantially identical in absolute values, it can be seen that the transistor MP1 again acts as an excellent follower, its source voltage very closely following the gate voltage independently of the amplitude of the input signal dv.

The small variations dv on the input are therefore reflected fully on the resistor of value R connected to the drain of MP1. The same applies for the transistor MP1', with an opposite variation (−dv). The overall resistance of value 2R sees a voltage variation 2dv at its terminals. It is passed through by a current variation 2dv/2R which will flow in the transistors MN3 (in one direction) and MN3' (in the other direction).

This current variation, as well as the common bias current $I=I_{B1}-I_{B2}$ is mirrored by the transistors MN4 and MN4' to form the output differential currents I−di=I−dv/R in one direction on S, and I+di=I+dv/R in the other direction on S'. The amplifier therefore has a transconductance di/dv equal to 1/R for the small signals; this transconductance is well controlled and very linear. Here again, it is assumed that the current mirroring is done with a factor 1, but it would be possible to have a different factor by choosing a ratio of geometries different from 1 between the transistors MN3 and MN4.

Figure 3:
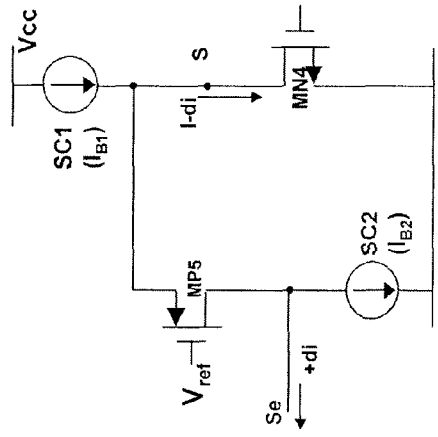
FIG. 3 represents a non-differential transconductance amplifier.

The scheme of FIG. 2 is designed for a differential application, but it is possible to envisage the same scheme with a simple (non-differential) input voltage and a simple output current. FIG. 3 represents such a scheme. A complete half of the amplifier has been eliminated, in this case the right half. The center point of the resistors of value R is now directed to the ground reference. The voltage variations dv in small signals are carried over to the drain of the transistor MP1, and are converted by the resistor R into current variations dv/R, that is, the same value as previously.

In a refinement, it is also possible to provide for the current source $I_{B1}$ (and obviously also $I'_{B1}$ in the differential scheme) to be servo controlled relative to the common-mode voltage present on the commoned drains of the transistors MP1 and MN2. In practice, the variation of this common-mode voltage can be reflected in a variation of the constant current from the source $I_{B1}$, quite simply because of the natural transconductance of this source. This is why it is preferable to servo control the current from the source by a feedback circuit CMFB which receives the common-mode voltage on the drains of the transistors MP1 and MN2 and which creates a control signal for the source $I_{B1}$. The action of the control signal goes in one direction which tends to oppose the direction of natural variation of the voltage according to the current. A small common-mode feedback circuit CMFB can therefore be provided, receiving on the one hand the common-mode voltage on these drains and on the other hand a voltage reference Vref; the feedback circuit produces a control voltage from the source $I_{B1}$ (for example a bias voltage on the gate of a transistor forming this source). If the common-mode voltage deviates in one direction or in the other of the reference, the resulting current variation $I_{B1}$ tends to converge thereto.

Figure 4:
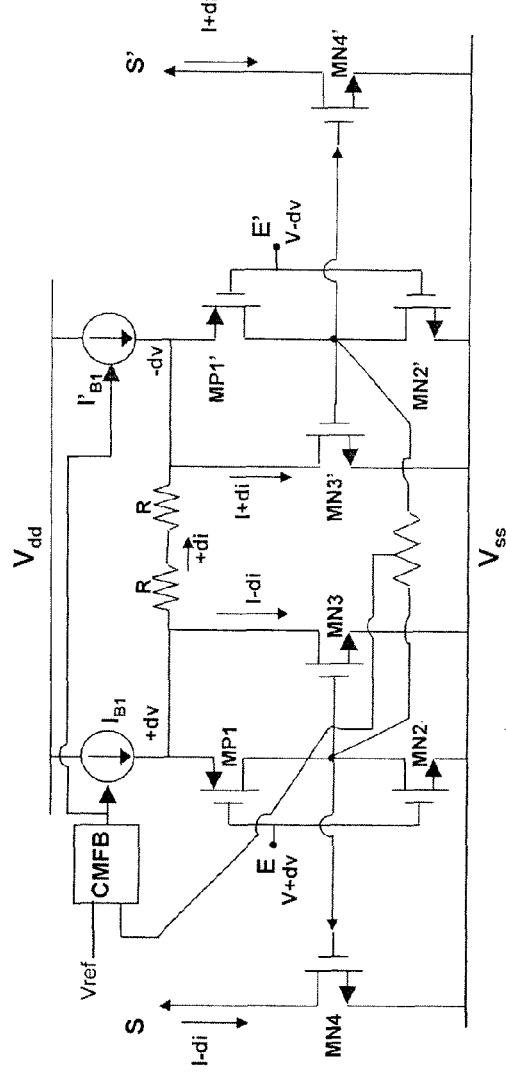
FIG. 4 represents a refinement of the amplifier of FIG. 2.

FIG. 4 represents this circuit configuration. It is a differential assembly but the same control is applied to both current sources $I_{B1}$ and $I'_{B1}$; the common-mode voltage is then tapped on the center point of a resistive divider bridge connected between the commoned drains of MP1 and MN2 on the one hand, MP1' and MN2' on the other hand. Another solution is to tap the common-mode voltage not at this point but, in the case of a sample-and-hold device on the sampling capacitors (not represented) that are placed downstream of the output transistors MN4 and MN4' and which integrate the output currents di and −di. These capacitors are then charged during a sampling phase then commoned during a holding phase during which they are applied as input signal to the CMFB circuit. The aim of this regulation circuit is to regulate the bias currents $I_{B1}$, $I'_{B1}$ so that the common-mode voltage on the sampling capacitors (at the output of the sample-and-hold device) remains constant regardless of the technology or production dispersion. This offers the benefit of keeping a maximum value for the wanted signal dynamics, and consequently of avoiding distortions.

Figure 5:
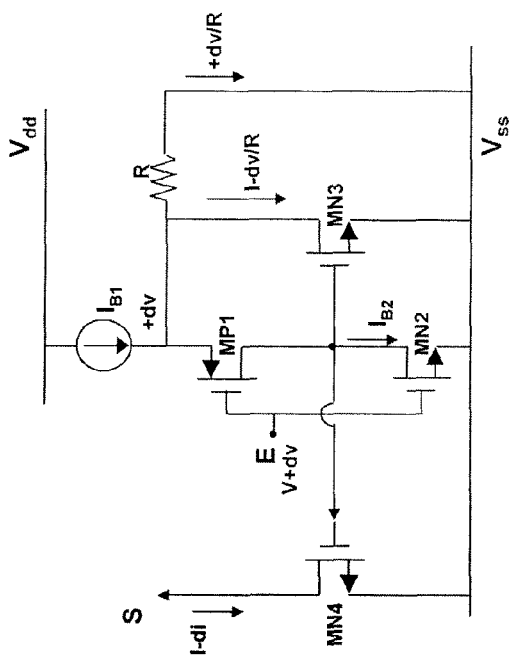
FIG. 5 represents a possible output stage for the transconductance amplifier.

FIG. 5 represents an output stage that can be connected downstream of the transistor MN4 or MN4' which supplies the current I−di or I+di. This output stage is intended to eliminate the common bias current I and to supply only the current di, in order, for example, to sample a quantity of charges representative of the current di in a switched capacitor.

It has been seen that the current I is the difference between the current from the source $I_{B1}$ which feeds the assembly of the transistors MP1, MN2, MN3 and the resistor 2R and the current $I_{B2}$ which passes through the transistors MP1 and MN2 in the absence of signal dv.

A so-called "folded cascode" assembly is used with a transistor MP5, of the same type as MP1, that is PMOS. This transistor MP5 has its source connected to the drain of the transistor MN4 of the mirroring stage (therefore to the output of the mirroring circuit); the assembly comprising the source of MP5 and the drain of MN4 is powered by a current source SC1 of a value equal to $I_{B1}$. The drain of MP5 is powered by a current source SC2 of a value equal to $I_{B2}$.

In these conditions, it can be seen that the transistor MP5 is necessarily passed through by a current $I_{B1}-(I-di)$, that is to say $I_{B1}-(I_{B1}-I_{B2}-di)$, or even $I_{B2}+di$. Since the current source SC2 consumes $I_{B2}$, the current di is evacuated toward the output Se tapped on the drain of MP5. This output Se can be connected through a system of switches to a sampling capacitor if the amplifier is used in a sample-and-hold device.

FIG. 6 represents the application of the transconductance amplifier to a sampling circuit, intended notably for a rapid analog/digital converter, the sampling circuit in addition performing an Nth order decimation, that is to say, a production of output samples at a frequency N times less than the sampling frequency Fe. Thus, the system includes a sampling clock supplying sampling phases $\Phi_S$ with a frequency Fe and a clock of frequency less than Fe/N supplying phases $\Phi_S/N$ corresponding to the duration of N successive samples.

In this example, the amplifier is of differential type and it is designated by the reference AGM; it has an input receiving the voltage dv to be converted (only the small signals, and not the common-mode voltage V, are considered here). It has outputs S1 and S2 supplying the currents di and −di. It is assumed here that the current di is a current outgoing over S1 and the current −di is a current incoming over S2, so that a current +di also leaves S2. Not represented are the means for obtaining an incoming current, but this can be done using current mirrors.

The scheme that is represented corresponds to a sampling application in which the sampler alternately delivers samples I and Q in phase quadrature, which presupposes two separate sampling capacitors. Furthermore, the scheme corresponds to an application in which the samples are placed alternately in two different capacitors, so that a sample is stored in a first capacitor while the preceding sample, held, is read by a downstream circuit (an analog/digital converter for example). This is why, instead of a single sampling capacitor which would theoretically be sufficient, FIG. 6 includes four capacitors, $C_{EI}$ and $C'_{EI}$ which operate alternately for the phase I and $C_{EQ}$ and $C'_{EQ}$ which operate alternately for the phase in quadrature Q.

Furthermore, each capacitor successively receives a sample of charges from the differential output S1 followed by a sample of charges from the differential output S2, with opposite signs so that the samples are added and not subtracted in the capacitor.

The capacitors $C_{EI}$ and $C_{EQ}$ receive samples during the phases $\Phi_S/N$ of the decimation frequency Fe/N. They are read during the complementary phases of this frequency. The zero reset by a phase $\Phi_{RS}$ takes place at the end of the complementary phase. The capacitors designated by the apostrophe work alternately with the first.

In FIG. 6, the switches of the filter are designated by the phases that control them; these switches are of three kinds:
- those that are actuated by pulses at the sampling frequency Fe; the index 1 in the name of the phase signifies that they apply to a capacitor the output S1 of the differential transconductance amplifier; the index I or Q signifies that they concern the storage of a sample I or Q;
- those that are actuated by the decimation frequency Fe/N, the phases being inverted for the capacitors assigned an apostrophe;
- and those that are actuated by the zero reset pulse $\Phi_{RS}$.

During a sampling phase relating to the capacitors $C_{EI}$ and $C_{EQ}$, four switchings occur in succession:
- application of a sample of charges of the output S to the capacitor $C_{EI}$;
- in phase quadrature, that is to say with a time offset of a quarter period 1/Fe of the sampling clock, application of a sample of the output S1 to the capacitor $C_{EQ}$;
- on the next clock pulse, application of a sample of the output S2 to the capacitor $C_{EI}$;
- and finally, with a new offset in quadrature, application of a sample of the output S2 to the capacitor $C_{EQ}$.

The timing diagram of the corresponding signals is represented in FIG. 7.

The output of the sampling block of the pathway I supplies a sampled analog level Vech-I; the output of the sampling block of the pathway Q supplies a sampled analog level Vech-Q.

In all of the foregoing, the MOS transistors can be replaced by bipolar transistors as indicated.

The invention claimed is:

1. A transconductance amplifier for the conversion of small electrical voltage variations dv into electrical current variations di, comprising a series assembly of a first and a second transistors of opposite types connected by their drains, the gate of the first transistor being connected to an input for signals to be converted into current, the source of the first transistor being connected to a constant current source and to a resistor and to the drain of a third transistor of the same type as the second transistor, the sources of the second and third transistors being connected together, the gate of the third transistor being connected to the drains of the first and second transistors, and the amplifier also including a circuit for mirroring the current of the third transistor, wherein the gate of the second transistor is connected to the gate of the first transistor.

2. The transconductance amplifier as claimed in claim 1, further comprising a feedback circuit for controlling the value of the current source in a direction tending to keep the voltage as constant as possible on the drains of the first and second transistors.

3. The transconductance amplifier as claimed in claim 1 wherein the resistor is also connected to a fixed potential, the transconductance amplifier receiving a non-differential input voltage.

4. A transconductance differential amplifier, comprising two single transconductance amplifiers as claimed in claim 1, the voltage variations to be converted being applied between the gates of the respective first transistors of the two single transconductance amplifiers, the differential amplifier having two current outputs supplied from the respective mirroring circuits of the two single transconductance amplifiers, the resistor being connected between the drains of the respective first transistors of the two single amplifiers.

5. The transconductance differential amplifier as claimed in claim 1 wherein the mirroring circuit comprises a fourth transistor of the same type as the third transistor, the drain of said fourth transistor supplying current variations that are proportional to the voltage variations to be sampled, the amplifier also including an output stage connected to the drain of the fourth transistor, this output stage including a fifth transistor of a type opposite to the third transistor, the fifth transistor having a source of which is connected to the drain of the fourth transistor, the gate of the fifth transistor being biased with a constant potential and the drain of the fifth transistor being connected to a source of constant current.

6. A sample-and-hold device having at least one sampling capacitor and further comprising at least one transconductance amplifier according to claim 1 for charging, during a periodic sampling phase of fixed duration, said at least one sampling capacitor.

7. The transconductance amplifier as claimed in claim 2, wherein the resistor is also connected to a fixed potential, the transconductance amplifier receiving a non-differential input voltage.

8. A transconductance differential amplifier, comprising two single transconductance amplifiers as claimed in claim 2, the voltage variations to be converted being applied between the gates of the respective first transistors of the two single transconductance amplifiers, the differential amplifier having two current outputs supplied from the respective mirroring circuits of the two single transconductance amplifiers, the resistor being connected between the drains of the respective first transistors of the two single amplifiers.

9. A sample-and-hold device having at least one sampling capacitor and further comprising at least one transconductance amplifier according to claim 4 for charging, during a periodic sampling phase of fixed duration, said at least one sampling capacitor.

10. A transconductance differential amplifier, comprising two single transconductance amplifiers as claimed in claim 3, the voltage variations to be converted being applied between the gates of the respective first transistors of the two single transconductance amplifiers, the differential amplifier having two current outputs supplied from the respective mirroring circuits of the two single transconductance amplifiers, the resistor being connected between the drains of the respective first transistors of the two single amplifiers.

11. The transconductance differential amplifier as claimed in claim 2, wherein the mirroring circuit comprises a fourth transistor of the same type as the third transistor, the drain of said fourth transistor supplying current variations that are proportional to the voltage variations to be sampled, the amplifier also including an output stage connected to the drain of the fourth transistor, this output stage including a fifth transistor of a type opposite to the third transistor, the fifth transistor having a source connected to the drain of the fourth transistor, the gate of the fifth transistor being biased with a constant potential, and the drain of the fifth transistor being connected to a source of constant current.

12. The transconductance differential amplifier as claimed in claim 3, wherein the mirroring circuit comprises a fourth transistor of the same type as the third transistor, the drain of said fourth transistor supplying current variations that are proportional to the voltage variations to be sampled, the amplifier also including an output stage connected to the drain of the fourth transistor, this output stage including a fifth transistor of a type opposite to the third transistor, the fifth transistor having a source connected to the drain of the fourth transistor, the gate of the fifth transistor being biased with a constant potential, and the drain of the fifth transistor being connected to a source of constant current.

13. The transconductance differential amplifier as claimed in claim 4, wherein the mirroring circuit comprises a fourth transistor of the same type as the third transistor, the drain of said fourth transistor supplying current variations that are proportional to the voltage variations to be sampled, the amplifier also including an output stage connected to the drain of the fourth transistor, this output stage including a fifth transistor of a type opposite to the third transistor, the fifth transistor having a source connected to the drain of the fourth transistor, the gate of the fifth transistor being biased with a constant potential, and the drain of the fifth transistor being connected to a source of constant current.

* * * * *